US012113451B2

(12) United States Patent
Hayashi

(10) Patent No.: US 12,113,451 B2
(45) Date of Patent: Oct. 8, 2024

(54) POWER CONVERSION DEVICE AND ARRANGEMENT OF A WIRE THEREIN

(71) Applicant: Mitsubishi Electric Corporation, Tokyo (JP)

(72) Inventor: Ryoma Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 239 days.

(21) Appl. No.: 17/630,248

(22) PCT Filed: Mar. 6, 2020

(86) PCT No.: PCT/JP2020/009686
§ 371 (c)(1),
(2) Date: Jan. 26, 2022

(87) PCT Pub. No.: WO2021/090520
PCT Pub. Date: May 14, 2021

(65) Prior Publication Data
US 2022/0286059 A1    Sep. 8, 2022

(30) Foreign Application Priority Data
Nov. 7, 2019   (JP) .................................. 2019-202011

(51) Int. Cl.
*H02M 7/00*      (2006.01)
*H01H 85/02*     (2006.01)
(Continued)

(52) U.S. Cl.
CPC .......... *H02M 7/003* (2013.01); *H05K 7/2089* (2013.01); *H01H 85/0241* (2013.01); *H01H 2085/0275* (2013.01); *H02M 3/003* (2021.05)

(58) Field of Classification Search
CPC . H05K 7/2089–209; H01H 2085/0275; H01H 85/0241; H02M 7/003; H02M 3/003
See application file for complete search history.

(56) References Cited

U.S. PATENT DOCUMENTS 5,196,819 A * 3/1993 Roberts ................ H01H 85/046
337/231
5,757,624 A    5/1998 Kawaguchi
(Continued)

FOREIGN PATENT DOCUMENTS

EP    3 664 274 A1    6/2020
JP    09-169217 A    6/1997
(Continued)

OTHER PUBLICATIONS

Extended European Search Report issued Nov. 9, 2022 in European Application No. 20884109.8.
(Continued)

*Primary Examiner* — Zachary Pape
(74) *Attorney, Agent, or Firm* — Sughrue Mion, PLLC; Richard C. Turner

(57) ABSTRACT

A power conversion device includes a power conversion unit for converting input power to output power; a connector for making connection to outside; a wire connected to the connector on one side and having a terminal on another side; and a first electric component connected to the terminal, wherein the first electric component is provided so as to overlap the wire as seen in a direction perpendicular to an extending direction of the wire.

7 Claims, 7 Drawing Sheets

(51) Int. Cl.
  *H02M 3/00* (2006.01)
  *H05K 7/20* (2006.01)

(56) References Cited

U.S. PATENT DOCUMENTS

| | | | |
|---|---|---|---|
| 6,734,781 B1* | 5/2004 | Nagashima | H01H 37/761 |
| | | | 337/159 |
| 2006/0026824 A1* | 2/2006 | Kramer | H01R 11/281 |
| | | | 29/751 |
| 2017/0338734 A1 | 11/2017 | Nakashima et al. | |
| 2021/0099072 A1 | 4/2021 | Uryu | |

FOREIGN PATENT DOCUMENTS

| | | |
|---|---|---|
| JP | 2010-033845 A | 2/2010 |
| JP | 2015-146714 A | 8/2015 |
| JP | 2016-192837 A | 11/2016 |
| JP | 2017-60311 A | 3/2017 |
| WO | 2009/060724 A1 | 5/2009 |
| WO | 2014/057622 A1 | 4/2014 |
| WO | 2017/149763 A1 | 9/2017 |
| WO | 2018/193589 A1 | 10/2018 |
| WO | 2019/026339 A1 | 2/2019 |

OTHER PUBLICATIONS

Japanese Office Action of Japanese Application No. 2019-202011 dated Jun. 17, 2020.
Japanese Office Action of Japanese Application No. 2019-202011 dated Sep. 28, 2020.
Japanese Reconsideration Report of Japanese Application No. 2019-202011 dated Dec. 2, 2020.
International Search Report of PCT/JP2020/009686 dated Jun. 30, 2020 [PCT/ISA/210].
European Office Action issued Dec. 20, 2023 in Application No. 20 884 109.8.

* cited by examiner

POWER CONVERSION DEVICE AND ARRANGEMENT OF A WIRE THEREIN

CROSS REFERENCE TO RELATED APPLICATIONS

This application is a National Stage of International Application No. PCT/JP2020/009686, filed Mar. 6, 2020, claiming priority to Japanese Patent Application No. 2019-202011, filed Nov. 7, 2019.

TECHNICAL FIELD

The present disclosure relates to a power conversion device.

BACKGROUND ART

A plurality of power conversion devices are mounted on an electric vehicle in which a motor is used as a drive source, as in an electric car or a hybrid car. The power conversion devices are, for example, a charger which converts commercial AC power to DC power to charge a high-voltage battery, a DC/DC converter which converts DC power of the high-voltage battery to voltage (e.g., 12 V) for an auxiliary-device battery, and an inverter which converts DC power from a battery to AC power for a motor.

In recent years, for purposes such as reducing a mounting space for the power conversion device provided in an electric vehicle, size reduction of the power conversion device has been attempted. In attempting size reduction, size reduction by arrangement of electric components mounted in the power conversion device has become increasingly important.

Meanwhile, in a conventional power conversion device, it is disclosed that a harness is generally used as wires for connecting an internal power conversion unit and a connector for making connection to the outside (see, for example, Patent Document 1).

CITATION LIST

Patent Document

Patent Document 1: WO2014/057622

SUMMARY OF THE INVENTION

Problems to be Solved by the Invention

In a harness used for a power conversion device, a terminal for easily connecting the harness and the power conversion unit may be attached to an end of the harness. In a process for manufacturing a terminal-equipped harness provided with a terminal in advance as described above, the harness needs to be held at the time of crimping the terminal to the harness. Therefore, the harness has a minimum necessary length for holding the harness, besides the part where the terminal is crimped. Thus, the terminal-equipped harness used for the power conversion device needs to have a certain length in accordance with constraints in manufacturing.

In the case of using the harness as the wires for the power conversion device, an area projected between the connector and the power conversion unit when the power conversion device is viewed from above, for example, becomes larger by an amount corresponding to the length of the harness. Thus, using the harness poses a problem that it becomes difficult to reduce the size of the power conversion device.

The present disclosure has been made to solve the above problem, and an object of the present disclosure is to provide a power conversion device for which size reduction is achieved by efficiently mounting wires and electric components.

Solution to the Problems

A power conversion device according to the present disclosure includes: a power conversion unit for converting input power to output power; a connector for making connection to outside; a wire connected to the connector on one side and having a terminal on another side; and a first electric component connected to the terminal. The first electric component is provided so as to overlap the wire as seen in a direction perpendicular to an extending direction of the wire.

Effect of the Invention

In the power conversion device according to the present disclosure, wires and electric components are efficiently mounted, whereby size reduction can be achieved.

DESCRIPTION OF EMBODIMENTS

Figure 1:
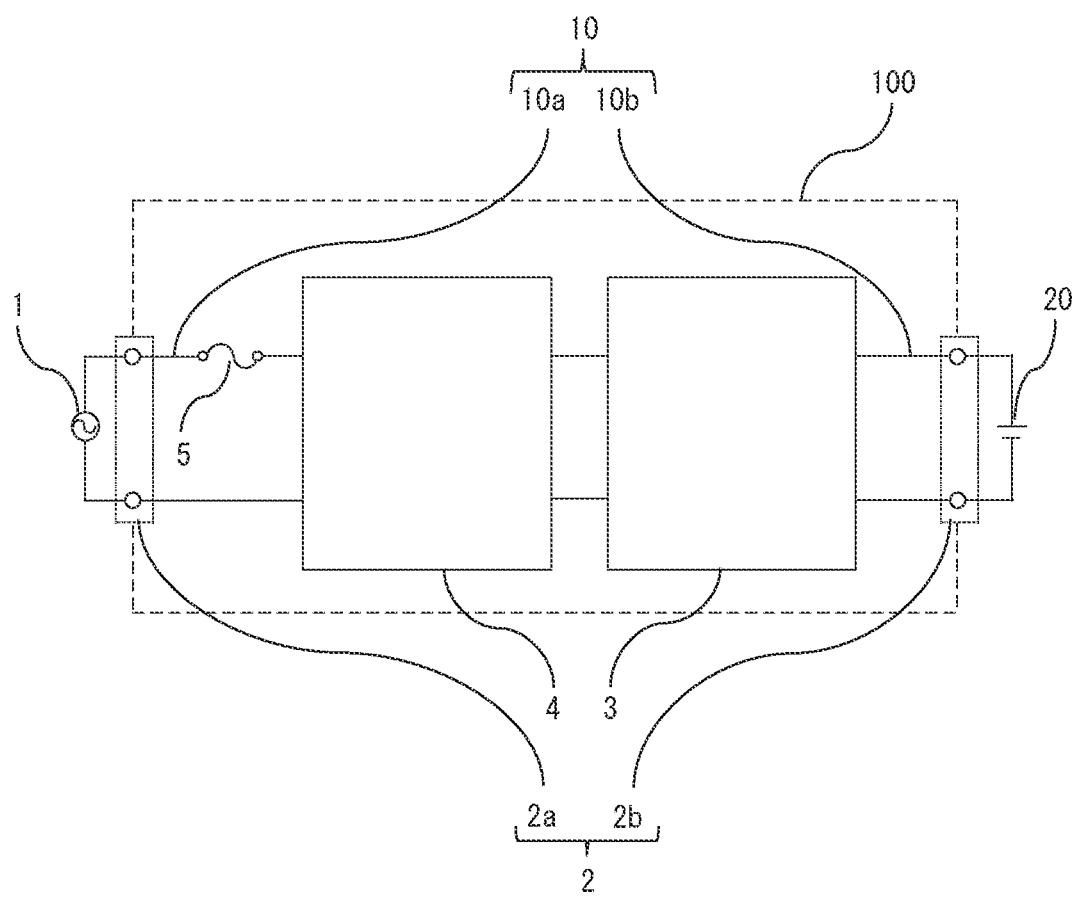
FIG. 1 schematically shows the configuration of a power conversion device according to embodiment 1.

Hereinafter, a power conversion device according to embodiments of the present disclosure will be described with reference to the drawings. In the drawings, the same or corresponding members and parts are denoted by the same reference characters, to give description.

Embodiment 1

FIG. 1 schematically shows the configuration of a power conversion device 100 according to embodiment 1. The power conversion device 100 converts AC power inputted from an AC power supply 1 to DC power having predetermined voltage by a power conversion unit 3 and supplies the DC power to a load 20. The power conversion device 100 includes connectors 2, the power conversion unit 3, a noise filter circuit 4, and a fuse 5. Such parts are connected via wires 10. The connectors 2 are input and output ends to be connected to the outside of the power conversion device 100, and are provided as connectors 2a, 2b on both of the input side and the output side. AC power outputted from the AC power supply 1 is inputted to the inside of the power conversion device 100 via the connector 2a on the input side. The load 20 is connected to the inside of the power conversion device 100 via the connector 2b on the output side. Wires 10a, 10b are respectively connected to the connectors 2a, 2b, and for example, a low-height harness is used as these wires 10.

The power conversion unit 3 is composed of a plurality of semiconductor switching elements such as diodes and transistors. These semiconductor switching elements generate high-frequency voltage/current components due to switching operations in power conversion. Electromagnetic noise arises from the high-frequency voltage/current components, and the electromagnetic noise causes electromagnetic noise malfunction on a peripheral device. In order to prevent the electromagnetic noise malfunction, the noise filter circuit 4 is provided between the AC power supply 1 and the power conversion unit 3.

The noise filter circuit 4 reduces leakage of electromagnetic noise to the outside. The noise filter circuit 4 is composed of, for example, an X-capacitor connected between AC power supply lines, a Y-capacitor connected between the AC power supply line and the ground, a common-mode choke coil formed by providing two windings around one magnetic core, and the like.

In general, the power conversion device 100 is provided with the fuse 5 which melts upon occurrence of failure and separates the AC power supply 1 and the power conversion unit 3 from each other. The fuse 5 is provided between the noise filter circuit 4 and the connector 2a, for example.

In the power conversion device 100 shown in FIG. 1, the input power supply is the AC power supply 1, as an example, but the input power supply is not limited thereto, and a DC power supply may be used as the input power supply. In the case of using a DC power supply as the input power supply and converting the power thereof to DC power having predetermined voltage, an isolation-type full-bridge DC/DC circuit or the like is used for the configuration of the power conversion unit 3. The power conversion unit 3 may be configured to perform conversion to AC power having predetermined voltage.

Figure 2:
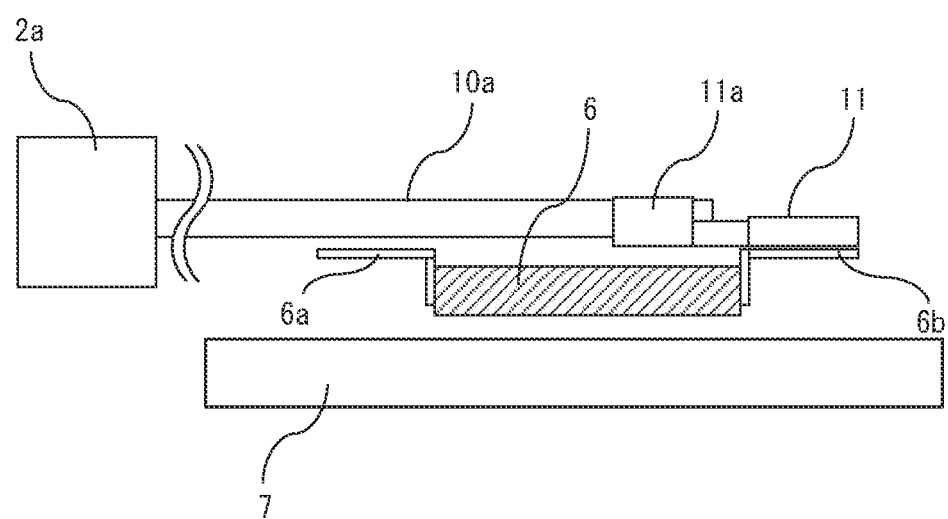
FIG. 2 is a side view of a part of the power conversion device according to embodiment 1.
Figure 3:
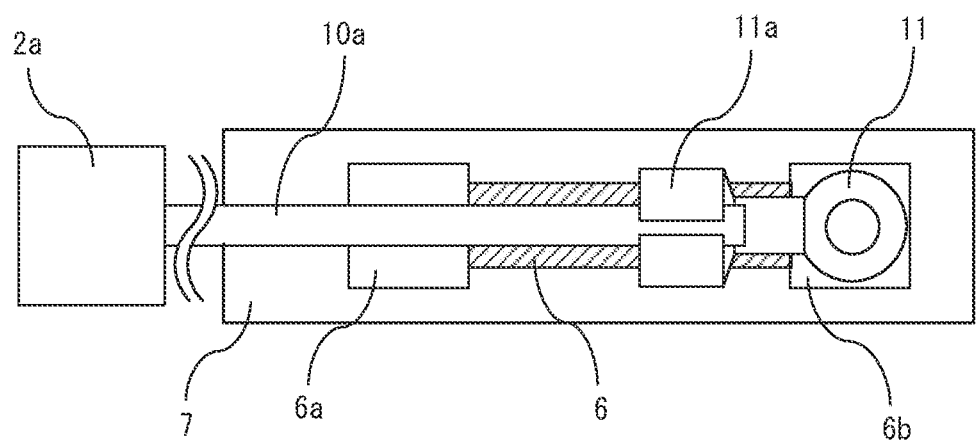
FIG. 3 is a plan view of a part of the power conversion device according to embodiment 1.

An example of mounting of the wire 10a inside the power conversion device 100 and the fuse 5 which is a first electric component 6 connected to the wire 10a, will be described. FIG. 2 is a side view of a part on the input side of the power conversion device 100 according to embodiment 1, and shows a part around the wire 10a and the first electric component 6. FIG. 3 is a plan view of a part of the power conversion device 100 as seen in a direction perpendicular to the extending direction of the wire 10a in the side view shown in FIG. 2. The wire 10a is connected to the connector 2a on one side, and has a terminal 11 on the other side. The terminal 11 is connected to the wire 10a by crimping a crimp portion 11a of the terminal 11 to an end of the wire 10a.

The first electric component 6 has a terminal 6a and a terminal 6b at respective opposing side surfaces of a body portion of the first electric component 6. The terminal 6b is connected to the terminal 11. The connection between the terminal 11 and the terminal 6b is made by fastening with a screw, welding, soldering, or the like. The terminal 6a is connected to the noise filter circuit 4 or the power conversion unit 3. Regarding specific connection of the terminal 6a, although not shown in FIG. 2 and FIG. 3, for example, the terminal 6a may be connected to a wiring board so as to be connected to another electric component via the wiring board, or the terminal 6a may be connected to a harness, a busbar, or the like so as to be connected to a wiring board via the harness or the busbar.

The first electric component 6 is provided so as to overlap the wire 10a as seen in the direction perpendicular to the extending direction of the wire 10a. In FIG. 2, the entire length of the first electric component 6 in the extending direction of the wire 10a overlaps the wire 10a. The reason why the overlapping arrangement is needed will be described. In the manufacturing process for the wire 10a when attaching the terminal 11, the wire 10a needs to be held at the time of crimping the crimp portion 11a of the terminal 11 and therefore the wire 10a has a minimum necessary length for holding the wire 10a. Thus, the wire 10a needs to have a certain length due to constraints in manufacturing. Therefore, in the case of using the wire 10a for connecting the connector 2 and the first electric component 6, the distance from the connector 2 to the first electric component 6 increases, so that the size of the power conversion device 100 is enlarged. For example, as shown in FIG. 3, when the wire 10a is seen in the direction perpendicular to the extending direction of the wire 10a, if the wire 10a and the first electric component 6 are arranged so as to overlap each other, an area where only the wire 10a is projected can be reduced by a projected area of the first electric component 6. Therefore, the power conversion device 100 can be downsized.

As shown in FIG. 2, the power conversion device 100 is provided with a cooler 7 for cooling the first electric component 6. As shown in FIG. 3, as seen in the direction perpendicular to the extending direction of the wire 10a, the cooler 7 is provided so as to overlap the first electric component 6, and is mounted to a housing (not shown) of the power conversion device 100. In FIG. 3, the cooler 7 has a size within the vicinity area of the first electric component 6. However, the size of the cooler 7 is not limited thereto, and may have a larger size so as to cool an area including another part. The cooler 7 is configured such that, for example, a coolant flows through a coolant passage formed inside the cooler 7 and thus the first electric component 6 is cooled by the coolant. The reason why the first electric component 6 needs to be cooled will be described. The first electric component 6 provided on the input side is a high-power component. Therefore, the first electric component 6 generates heat, and in order to reduce the heat generation density, the size of the first electric component 6 needs to be enlarged. If the cooler 7 is provided so as to overlap the first electric component 6, the first electric component 6 is cooled. Since the first electric component 6 is cooled, heat generation in the first electric component 6 is suppressed, and thus size increase of the first electric component 6 can be prevented. Therefore, the power conversion device 100 can be downsized.

The first electric component 6 is, for example, the fuse 5 shown in FIG. 1. In the power conversion device 100 in which high power is applied, the fuse 5 generally used is a tube fuse type having a low height and a large projected area. If the fuse 5 and the wire 10a having a low height are arranged so as to overlap each other, they can be arranged at a height equivalent to other provided electric components, inside the power conversion device 100. That is, the wire 10a and the fuse 5 can overlap each other without changing the height of the power conversion device 100, and the area where only the wire 10a is projected can be reduced. Although the first electric component 6 has been described as the fuse 5, the first electric component 6 may be one of electric components included in the power conversion unit 3 or the noise filter circuit 4.

Figure 4:
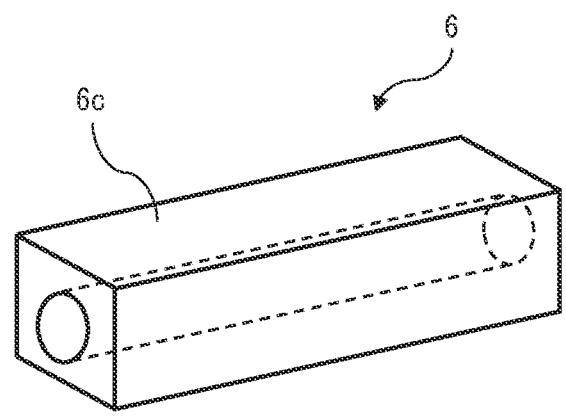
FIG. 4 is a perspective view schematically showing the outer appearance of a first electric component of the power conversion device according to embodiment 1.

The first electric component 6 is covered by insulation resin 6c such as polybutylene terephthalate. FIG. 4 is a perspective view schematically showing the outer appearance of the first electric component 6 of the power conversion device 100 according to embodiment 1. In FIG. 4, the terminal 6a and the terminal 6b are not shown. The reason for covering the first electric component 6 by the insulation resin will be described. Since the first electric component 6 is a high-power component, the first electric component 6 and the cooler 7, i.e., the housing of the power conversion device 100, need to be separated from each other by a certain insulation distance in accordance with an applied power value, so that the size of the power conversion device 100 is enlarged. If the first electric component 6 is covered by the insulation resin, the insulation distance for the separation can be shortened. Therefore, the power conversion device 100 can be downsized. In addition, since the first electric component 6 is covered by the insulation resin, the first electric component 6 can be located closer to the cooler 7. The closer arrangement can further suppress heat generation in the first electric component 6, and thus the first electric component 6 and the power conversion device 100 can be downsized.

Figure 5:
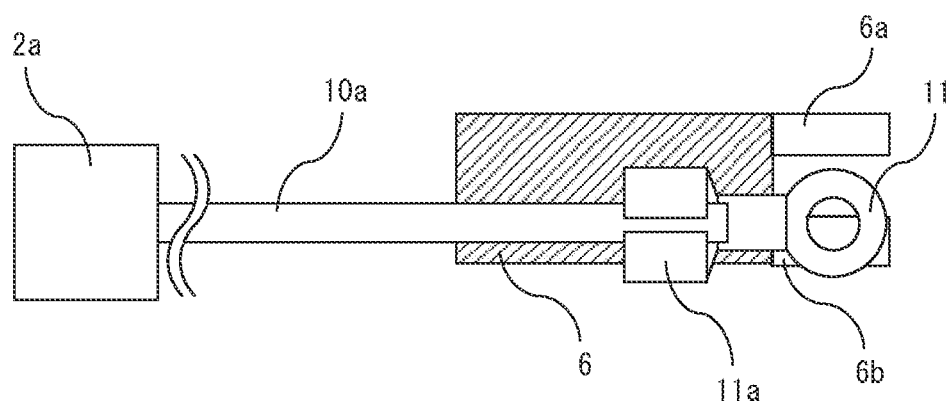
FIG. 5 is a plan view of a part of another power conversion device according to embodiment 1.

In the above description, the example in which the terminal 6a and the terminal 6b are provided at respective opposing side surfaces of the body portion of the first electric component 6 as shown in FIG. 2, has been described. However, arrangement of the terminal 6a and the terminal 6b provided to the first electric component 6 is not limited thereto. FIG. 5 is a plan view of a part of another power conversion device 100 according to embodiment 1, and shows a part around the wire 10a and the first electric component 6. The terminal 6a and the terminal 6b are provided so as to protrude in the same direction from one side of the first electric component 6. Also in the case where the terminal 6a and the terminal 6b are provided at the same side surface of the first electric component 6, if the first electric component 6 is provided so as to overlap the wire 10a as seen in the direction perpendicular to the extending direction of the wire 10a, the area where only the wire 10a is projected can be reduced by a projected area of the first electric component 6 overlapping the wire 10a.

In FIG. 2, the example in which the entire length of the first electric component 6 in the extending direction of the wire 10a overlaps the wire 10a has been shown. However, the range in which the first electric component 6 and the wire 10a overlap each other is not limited to the entire length. A part of the length of the first electric component 6 in the extending direction of the wire 10a may overlap the wire 10a, and also in this case, the area where only the wire 10a is projected can be reduced by the projected area of the first electric component 6 overlapping the wire 10a, so that the power conversion device 100 can be downsized.

As described above, the power conversion device 100 according to embodiment 1 includes the wire 10a connected to the connector 2 on one side and having the terminal 11 on another side, and the first electric component 6 connected to the terminal 11, and the first electric component 6 is provided so as to overlap the wire 10a as seen in the direction perpendicular to the extending direction of the wire 10a. Thus, the area where only the wire 10a is projected can be reduced by a projected area of the first electric component 6 overlapping the wire 10a, and the power conversion device 100 can be downsized owing to the efficient mounting of the wire 10a and the first electric component 6. In addition, in the case where the cooler 7 is provided so as to overlap the first electric component 6 as seen in the direction perpendicular to the extending direction of the wire 10a, heat generation in the first electric component 6 is suppressed.

Thus, size increase of the first electric component 6 can be prevented and the power conversion device 100 can be downsized. In addition, in the case where the first electric component 6 is covered by the insulation resin, the insulation distance for separation between the first electric component 6 and the surrounding part can be shortened, so that the power conversion device 100 can be downsized. In addition, since the first electric component 6 is covered by the insulation resin, the first electric component 6 can be located closer to the cooler 7. Thus, heat generation in the first electric component 6 can be further suppressed, so that the first electric component 6 and the power conversion device 100 can be downsized. In addition, in the case where the first electric component 6 is a fuse connected to the power conversion unit 3, the first electric component 6 can be provided at a height equivalent to other provided electric components, inside the power conversion device 100. Thus, the wire 10a and the fuse 5 can be arranged so as to overlap each other without changing the height of the power conversion device 100.

In the above description, the example of mounting of the wire 10a on the input side and the first electric component 6 connected to the wire 10a has been described. However, without limitation thereto, also for the wire 10b on the output side and an electric component connected to the wire 10b, the same configuration can be applied, whereby the power conversion device 100 can be downsized. The electric component connected to the wire 10b is, for example, a fuse.

Embodiment 2

Figure 6:
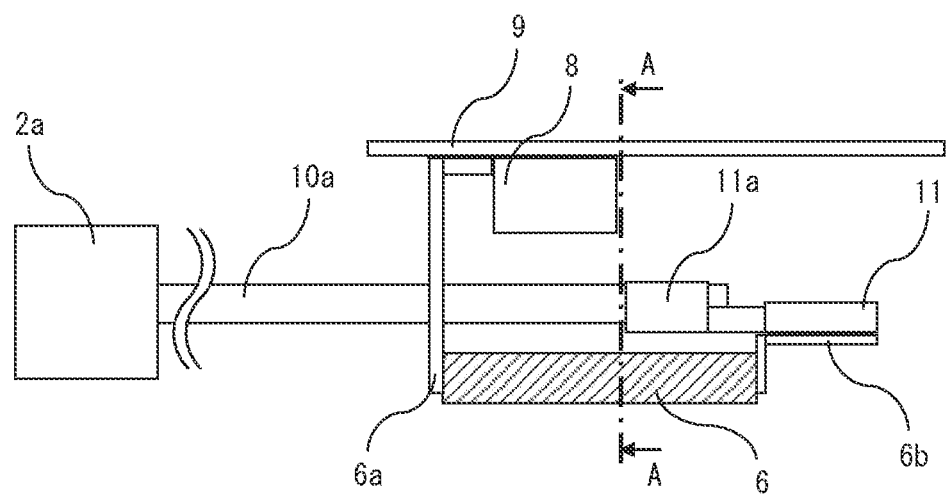
FIG. 6 is a side view of a part of a power conversion device according to embodiment 2.
Figure 7:
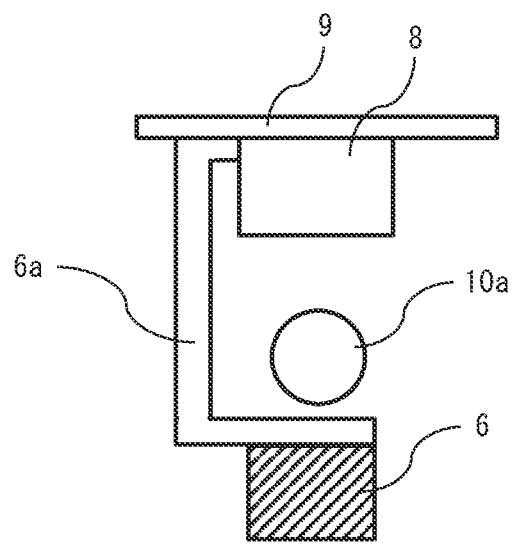
FIG. 7 is a sectional view along a dotted-dashed line A-A in FIG. 6.

A power conversion device 100 according to embodiment 2 will be described. FIG. 6 is a side view of a part on the input side of the power conversion device 100, and shows a part around the wire 10a and the first electric component 6. FIG. 7 is a sectional view along a dotted-dashed line A-A in FIG. 6 as seen in the arrow direction. In the power conversion device 100 according to embodiment 2, a second electric component 8 is provided so as to overlap the wire 10a and the first electric component 6 in addition to the configuration of the power conversion device 100 shown in embodiment 1.

The power conversion device 100 includes the second electric component 8, and the second electric component 8, the wire 10a, and the first electric component 6 are arranged so as to overlap each other. The second electric component 8 is provided so as to overlap the wire 10a as seen in the direction perpendicular to the extending direction of the wire 10a. In embodiment 2, the entire length of the second electric component 8 in the extending direction of the wire 10a overlaps the wire 10a. The second electric component 8 is, for example, the X-capacitor or the Y-capacitor used in the noise filter circuit 4. The X-capacitor or the Y-capacitor is a low-height component. Therefore, one or both of these components can be further provided so as to overlap the wire 10a and the first electric component 6 without changing the height of the power conversion device 100. Owing to such efficient mounting of low-height components, the power conversion device 100 can be downsized.

In the case where the second electric component 8 is mounted on a wiring board 9, the second electric component 8, the wire 10a, and the first electric component 6 are arranged such that the first electric component 6 and the second electric component 8 are located with the wire 10a therebetween. This arrangement is for avoiding arrangement in which the wiring board 9 is provided at such a position as to obstruct connection between the wire 10a and the first electric component 6. If the wiring board 9 is provided between the wire 10*a* and the first electric component 6, in order to connect the wire 10*a* and the first electric component 6, it is necessary to provide a hole in the wiring board 9 and connect the wire 10*a* and the first electric component 6 via the wiring board 9, so that the mounting process becomes difficult. Therefore, the second electric component 8, the wire 10*a*, and the first electric component 6 are arranged such that the first electric component 6 and the second electric component 8 are opposite to each other across the wire 10*a*.

As shown in FIG. 7, in connection between the first electric component 6 and the second electric component 8, the terminal 6*a* extends upward from the left side of the first electric component 6 in order to avoid contact with the wire 10*a*. The connection between the first electric component 6 and the second electric component 8 is not limited thereto. The terminal 6*a* may extend upward from the right side of the first electric component 6.

In the above description, the first electric component 6 and the second electric component 8 are connected via the terminal 6*a*. However, the connection configuration between the first electric component 6 and the second electric component 8 is not limited thereto. The second electric component 8 may be an electric component other than the X-capacitor or the Y-capacitor, and the first electric component 6 and the second electric component 8 may not be connected to each other. In the above description, the example in which the second electric component 8 is mounted on the wiring board 9 has been shown. However, the second electric component 8 is not limited to the configuration of being mounted to the wiring board 9, and may be an electric component provided alone as with the first electric component 6.

As described above, the power conversion device 100 according to embodiment 2 includes the second electric component 8, and the second electric component 8 is provided so as to overlap the wire 10*a* as seen in the direction perpendicular to the extending direction of the wire 10*a*. Thus, owing to the efficient mounting, the power conversion device 100 can be downsized. In addition, in the case where the second electric component 8 is mounted on the wiring board 9, and the first electric component 6 and the second electric component 8 are arranged with the wire 10*a* therebetween, the second electric component 8, the wire 10*a*, and the first electric component 6 can be easily mounted.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 AC power supply
2 connector
3 power conversion unit
4 noise filter circuit
5 fuse
6 first electric component
6*a* terminal
6*b* terminal
6*c* insulation resin
7 cooler
8 second electric component
9 wiring board
10 wire
11 terminal
11*a* crimp portion
20 load
100 power conversion device

The invention claimed is:

1. A power conversion device comprising:
   a power converter to convert input power to output power;
   a connector for making connection to outside;
   a wire connected to the connector on one side and having a terminal on another side, wherein the wire is connected to the fuse by the terminal, and the terminal is connected to the wire by a crimp portion; and
   a first electric component connected to the terminal, wherein
   the first electric component is a fuse connected to the power converter,
   the fuse is provided so as to overlap the wire as seen in a direction perpendicular to an extending direction of the wire,
   the fuse is a tube-type fuse,
   the wire is substantially straight as the wire extends from a connector of a harness to the crimp portion, and
   a center axis of the fuse and the wire are substantially parallel to each other.

2. The power conversion device according to claim 1, further comprising a cooler for cooling the first electric component, wherein
   the cooler is provided so as to overlap the first electric component as seen in the direction perpendicular to the extending direction of the wire.

3. The power conversion device according to claim 2, wherein
   the first electric component is covered by insulation resin.

4. The power conversion device according to claim 1, wherein
   the first electric component is covered by insulation resin.

5. The power conversion device according to claim 1, further comprising a second electric component, wherein
   the second electric component is provided so as to overlap the wire as seen in the direction perpendicular to the extending direction of the wire.

6. The power conversion device according to claim 5, wherein
   the second electric component is mounted on a wiring board, and
   the first electric component and the second electric component are arranged with the wire therebetween.

7. The power conversion device according to claim 1, wherein the wire is at least of a length sufficient to permit holding the wire in a manufacturing process for crimping the crimp portion.

* * * * *